(12) United States Patent
Kashirajima et al.

(10) Patent No.: US 8,199,504 B2
(45) Date of Patent: Jun. 12, 2012

(54) COOLING SYSTEM FOR ELECTRONIC EQUIPMENT

(75) Inventors: Yasuhiro Kashirajima, Tokyo (JP); Hiroshige Kikuchi, Tokyo (JP); Takumi Sugiura, Tokyo (JP); Koji Watanabe, Tokyo (JP); Kenichi Nakashima, Tokyo (JP)

(73) Assignee: Hitachi Plant Technologies, Ltd., Tokyo (JP)

( * ) Notice: Subject to any disclaimer, the term of this patent is extended or adjusted under 35 U.S.C. 154(b) by 36 days.

(21) Appl. No.: 12/945,345

(22) Filed: Nov. 12, 2010

(65) Prior Publication Data

US 2011/0056223 A1 Mar. 10, 2011

Related U.S. Application Data

(62) Division of application No. 12/368,360, filed on Feb. 10, 2009, now Pat. No. 7,855,890.

(30) Foreign Application Priority Data

Feb. 13, 2008 (JP) ................................. 2008-032096

(51) Int. Cl.
*H05K 7/20* (2006.01)
(52) U.S. Cl. ............... 361/700; 361/679.46; 361/679.53; 361/699; 361/701; 62/259.2; 62/299; 62/305; 165/80.4; 165/110; 165/104.33; 165/185
(58) Field of Classification Search ........... 361/679.46–679.53, 688, 689, 361/690–702, 724–730; 165/80.2–80.5, 165/110, 104.25–104.34, 185, 285; 62/99, 62/186, 259.2, 91, 122, 183, 299, 305, 203, 62/259.1, 228.4, 229, 310, 332, 440, 441, 62/506, 3, 75, 178, 199; 454/184, 187; 261/109, 261/111, 112.1, 104, 153, 160, 42, 85, 606, 261/723, 631; 702/182
See application file for complete search history.

(56) References Cited

U.S. PATENT DOCUMENTS 4,107,942 A 8/1978 Fairman
(Continued)

FOREIGN PATENT DOCUMENTS

CA 2 298 754 A1 8/2001
(Continued)

OTHER PUBLICATIONS

Partial European Search Report for Application No. EP 09 00 1786 Dated Nov. 25, 2010.

(Continued)

*Primary Examiner* — Michail V Datskovskiy
(74) *Attorney, Agent, or Firm* — Roberts Mlotkowski Safran & Cole, P.C.; David S. Safran

(57) ABSTRACT

In a cooling system for an electronic device of the present invention, server rooms in which a plurality of servers are placed, an evaporator which is provided close to each of the servers, and cools exhaust air from the server by vaporizing a refrigerant with heat generating from the server, a cooling tower which is provided at a place higher than the evaporator, cools the refrigerant by outside air and water sprinkling, and condenses the vaporized refrigerant, and a circulation line in which the refrigerant naturally circulates between the evaporator and the cooling tower. According to the cooling system, an electronic device which is required to perform a precise operation with a heat generation amount from itself being large, such as a computer and a server, can be efficiently cooled at low running cost.

18 Claims, 5 Drawing Sheets

U.S. PATENT DOCUMENTS

| | | | |
|---|---|---|---|
| 4,313,310 A * | 2/1982 | Kobayashi et al. | 62/175 |
| 4,843,832 A * | 7/1989 | Yamada et al. | 62/159 |
| 4,932,221 A * | 6/1990 | Shimizu et al. | 62/180 |
| 5,335,508 A | 8/1994 | Tippmann | |
| 6,446,448 B1 | 9/2002 | Wang et al. | |
| 6,532,754 B2 * | 3/2003 | Haley et al. | 62/129 |
| 6,601,397 B2 * | 8/2003 | Pham et al. | 62/181 |
| 6,775,137 B2 | 8/2004 | Chu et al. | |
| 6,786,056 B2 | 9/2004 | Bash et al. | |
| 6,924,981 B2 | 8/2005 | Chu et al. | |
| 6,938,433 B2 * | 9/2005 | Bash et al. | 62/229 |
| 7,051,802 B2 | 5/2006 | Baer | |
| 7,061,763 B2 | 6/2006 | Tsoi | |
| 7,340,912 B1 * | 3/2008 | Yoho et al. | 62/305 |
| 7,385,810 B2 | 6/2008 | Chu et al. | |
| 7,477,514 B2 | 1/2009 | Campbell et al. | |
| 7,511,959 B2 | 3/2009 | Belady et al. | |
| 7,738,251 B2 | 6/2010 | Clidarasta et al. | |
| 7,788,940 B2 * | 9/2010 | Madara et al. | 62/259.2 |
| 7,864,530 B1 * | 1/2011 | Hamburgen et al. | 361/699 |
| 7,900,468 B2 * | 3/2011 | Spearing | 62/259.2 |
| 7,963,118 B2 * | 6/2011 | Porter et al. | 62/259.2 |
| 2005/0120737 A1 * | 6/2005 | Borror et al. | 62/434 |
| 2007/0283716 A1 | 12/2007 | Marsala | |
| 2008/0029250 A1 | 2/2008 | Carlson et al. | |
| 2009/0080173 A1 | 3/2009 | Porter et al. | |
| 2009/0171512 A1 * | 7/2009 | Duncan | 700/300 |

FOREIGN PATENT DOCUMENTS

| | | |
|---|---|---|
| EP | 0 025 665 A1 | 3/1981 |
| EP | 1 134 523 A1 | 9/2001 |
| EP | 1 855 070 A2 | 11/2007 |
| JP | 1-97147 A | 4/1989 |
| JP | 1-277146 A | 11/1989 |
| JP | 5-126422 A | 5/1993 |
| JP | 7-19523 A | 1/1995 |
| JP | 10-19305 A | 1/1998 |
| JP | 11-257883 A | 9/1999 |
| JP | 2000-356421 A | 12/2000 |
| JP | 2002-156136 A | 5/2002 |
| JP | 2003-166729 A | 6/2003 |
| JP | 2004-132651 A | 4/2004 |
| JP | 2004-232927 A | 8/2004 |
| JP | 2005-249258 A | 9/2005 |
| JP | 2006-258390 A | 9/2006 |
| JP | 2007127315 A | 5/2007 |
| WO | 2004/049774 A1 | 6/2004 |

OTHER PUBLICATIONS

European Search Report Dated Oct. 6, 2011 for Corresponding European Application No. 09 001786 (Please Note That JP 11-257883A and CA 2298754A1 Were Submitted to the USPTO as an IDS on Dec. 28, 2010 and JP 10-019305A and JP 2007-127315A Were Submitted to the USPTO as an IDS on Nov. 12, 2010 for This Application).

Japanese Office Action Issued on March 4, 2011 for Application No. HP 2007-084, English Translation of Japanense Office Action Attached.

* cited by examiner

COOLING SYSTEM FOR ELECTRONIC EQUIPMENT

CROSS REFERENCE TO RELATED APPLICATION

This application is a continuation of commonly owned, co-pending U.S. patent application Ser. No. 12/368,360, filed Feb. 10, 2009.

BACKGROUND OF THE INVENTION

1. Field of the Invention

The present invention relates to a cooling system for an electronic device, and particularly, to a cooling system for an electronic device for efficiently cooling an electronic device which is required to perform a precise operation with a heat generation amount from itself being large, such as a computer and a server.

2. Description of the Related Art

In recent years, with improvement in the information processing technique and development of the Internet environments, the information processing amount which is required has increased, and data processing centers for processing various kinds of information in large volume are in the spotlights as business. For example, in the server room of the data processing center, a number of electronic devices such as computers and servers are installed in the concentrated state, and are continuously operated night and day. Generally, for installation of electronic devices in a server room, a rack mount method is a main stream. The rack mount method is the method for stacking racks (casings), which house electronic devices by dividing the electronic devices according to the functional unit, on a cabinet in layer. A number of such cabinets are arranged and disposed on the floor of a server room. These electronic devices which process information rapidly have improved in processing speed and processing capability, and the heat generation amount from the electronic devices continues to increase.

Meanwhile, these electronic devices require a constant temperature environment for operation, and the temperature environment for normal operation is set to be relatively low. Therefore, when the electronic devices are placed in a high-temperature state, they cause troubles such as system stops. Consequently, the fact is that the air-conditioning power which operates the air-conditioning machines for cooling the insides of the server rooms is significantly increased. Thus, reduction in the air-conditioning power becomes urgently necessary not only from the viewpoint of cost reduction in business management but also from the viewpoint of conservation of the global environment.

From such a background, the techniques for efficiently cooling electronic devices are proposed as seen in National Publication of International Patent Application No. 2006-507676, and Japanese Patent Application Laid-Open No. 2004-232927. National Publication of International Patent Application No. 2006-507676 proposes that a flow path for chilled air to flow in a closed loop via an electronic device is formed by mounting the electronic device with a back cover, a front cover and a side-mounted chilled air sub-frame, and providing a fan and a heat exchanger in the chilled air sub-frame.

Further, Japanese Patent Application Laid-Open No. 2004-232927 proposes that in an air-conditioning system for a computer room equipped with a rack group for storing electronic devices, which is internally mounted with an evaporator and a fan, the cooling air led from outside the room is caused to flow in an internal space under the floor to cool the electronic devices stored in the rack for storing electronic devices, through an evaporator, cools a condenser which is mounted on the rear surface of the rack for storing electronic devices, flows in a space at a rear surface or above the rack for storing electronic devices, and is discharged outdoor via a ventilator. Further, Japanese Patent Application Laid-Open No. 2007-127315 is not the invention relating to cooling of electronic devices, but introduces the art of naturally circulating a refrigerant between the evaporator and the condenser.

SUMMARY OF THE INVENTION

Incidentally, in the conventional cooling system for an electronic device, electronic devices are cooled by not only cooling by an air-conditioning machine, but also by using a cooling devices directly attached to the electronic devices in combination, and thereby, the effect of reducing the air-conditioning power of the air-conditioning machine can be expected.

However, the operation power for the cooling device which is directly attached to the electronic device is added, though the air-conditioning power is reduced, and therefore, the conventional cooling system cannot be said sufficient yet from the viewpoint of total energy saving. Accordingly, reduction in running cost by additional energy saving is required. Above all, energy saving in the respect of cooling by directly attaching the cooling device to the electronic device is desired.

The present invention is made in view of such circumstances, and has an object to provide a cooling system for an electronic device capable of efficiently cooling an electronic device which is required to perform a precise operation with an amount of heat generation from itself being large, such as a computer and a server, at low running cost.

In order to attain the above described object, a first aspect of the present invention provides a cooling system for an electronic device characterized by comprising a device room in which a plurality of electronic devices are placed, an evaporator which is provided close to each of the electronic devices, and cools exhaust air from the electronic device by vaporizing a refrigerant with heat generating from the electronic device, a cooling tower which is provided at a place higher than the evaporator, cools the refrigerant by outside air and water sprinkling, and condenses the vaporized refrigerant, and a circulation line in which the refrigerant naturally circulates between the evaporator and the cooling tower.

The present inventor paid attention to the fact that the heat generation amount from the electronic devices a plurality of which are placed in a device room has abruptly increased in recent years, and heat at a high temperature (high-temperature air) generates from the electronic devices. The present inventor has obtained the knowledge that the circulation line which naturally circulates the refrigerant between the evaporators provided close to the electronic devices and the cooling towers provided at the places higher than the evaporators and cooling the refrigerant with the outside air and water sprinkling for a long period throughout a year without needing a condenser (supplied with cold water from a refrigerator) and a compressor.

More specifically, according to the first aspect, the transportation power for transporting the vaporized refrigerant gas to the cooling tower installed at the place higher than the evaporator by promoting evaporation of the refrigerant by directly exchanging the high-temperature heat generated (discharged) from the electronic device (usually having the fan which takes in the air of the device room and discharges the air) in the high temperature state with the refrigerant flowing in the evaporator. Further, the refrigerant gas vaporized in the evaporator has a high temperature, and thereby, the cooling capacity for condensing the vaporized refrigerant gas and making the refrigerant gas a refrigerant liquid can be made small. Accordingly, instead of the condenser (supplied with cold water from the refrigerator), the cooling tower which cools the refrigerant with the outside air and water sprinkling can be used. The refrigerant liquid which is cooled and condensed flows down to the evaporator located downward from the cooling tower, and thereby, the circulation line in which the refrigerant naturally circulates between the evaporator and the cooling tower can be constructed.

By constructing the natural circulation line like this, the transportation power cost of the refrigerant is made unnecessary, and by using the cooling tower which cools the refrigerant with the outside air and the water sprinkling at the cooling side of the circulation line, the heat source load for cooling can be remarkably reduced, and the running cost for cooling the refrigerant can be significantly reduced.

A second aspect of the present invention is, in the first aspect, characterized by further comprising a heat exchanger which cools the refrigerant, a parallel line which is a flow path for the refrigerant, connected to the circulation line, and is provided so that the heat exchanger has parallel relation with respect to the cooling tower, and a parallel control mechanism which controls a refrigerant amount of the refrigerant which is fed to the parallel line from the circulation line.

The second aspect defines the control of the refrigerant which is fed to the cooling tower and the heat exchanger when the heat exchanger is disposed so as to have parallel relation with respect to the cooling tower.

According to the second aspect, as the device for cooling the refrigerant, in addition to the cooling tower, the heat exchanger which cools the refrigerant is connected parallel with the circulation line and constituted to have parallel relation with the cooling tower to control the refrigerant amount, which is fed to the heat exchanger, with the parallel control mechanism. Thereby, the cooling tower and the heat exchanger can be efficiently used so that the running cost becomes the minimum in accordance with the cold heat load necessary for condensing the refrigerant gas vaporized in the evaporator.

A third aspect of the present invention is, in the second aspect, characterized in that the parallel control mechanism comprises an outside air temperature sensor which measures outside temperature, a parallel valve which is provided in the parallel line, and regulates an amount of the refrigerant which is refrigerant gas returning from the evaporator and flowing into the heat exchanger, and a parallel control part which calculates capacity of cooling the refrigerant in the cooling tower from a measurement result of the outside air temperature sensor, and regulates an opening degree amount of the parallel valve from a result of the calculation to control a refrigerant amount which is fed to the heat exchanger.

The cooling capacity of the cooling tower significantly depends on the outside air temperature. Accordingly, by constituting the system as in the third aspect, a part of the refrigerant flowing in the circulation line can be made to flow into the heat exchanger automatically in accordance with the variation in the outside air temperature, and therefore, only insufficiency of the cooling capacity of the cooling tower is supplied by the heat exchanger. Thereby, the running cost can be further reduced.

In short, in order that the cooling tower can effectively use the outside air temperature, the operator of the cooling system sets the summer season, the intermediate season and the winter season. Here, generally, the summer season is set to be June to July, the spring season as the intermediate season is set to be March to May, the autumn season as the intermediate season is set to be September to November, and the winter season is set to be December to February, but small shift to before and after these settings does not matter.

A fourth aspect of the present invention is, in the second aspect, characterized in that the parallel control mechanism comprises a cooling tower outlet port sensor which measures refrigerant temperature and/or refrigerant pressure at an outlet port of the cooling tower, a parallel valve which is provided in the parallel line and regulates an amount of the refrigerant which is refrigerant gas returning from the evaporator and flowing into the heat exchanger, and a parallel control part which regulates an opening degree amount of the parallel valve so that a measurement result of the cooling tower outlet port sensor becomes a predetermined value to control a refrigerant amount which is fed to the heat exchanger.

The fourth aspect is another mode of the parallel control mechanism, and by measuring the refrigerant temperature or the refrigerant pressure of the cooling tower outlet port sensor provided at the cooling tower outlet port, the cooling capacity which the cooling tower has at the point of time of measurement can be grasped. Accordingly, the opening degree amount of the parallel valve is regulated based on the measurement result, and a part of the refrigerant flowing in the circulation line can be made to flow into the heat exchanger automatically. Therefore, only insufficiency of the cooling capacity of the cooling tower is supplied by the heat exchanger. Thereby, the running cost can be further reduced.

A fifth aspect of the present invention is, in the first aspect, characterized by further comprising a heat exchanger which cools the refrigerant, a series line which is a flow path for the refrigerant, connected to the circulation line, and is provided so that the heat exchanger has series relation with respect to the cooling tower, with the line being constituted so that the refrigerant returning from the evaporator reaches the heat exchanger after passing through the cooling tower, and a series control mechanism which controls cooling capacity of the heat exchanger.

The fifth aspect defines the control of the refrigerant which is fed to the cooling tower and the heat exchanger when the heat exchanger is disposed to have the series relation with respect to the cooling tower.

According to the fifth aspect, the refrigerant gas which returns from the evaporator is first cooled in the cooling tower, and next flows into the heat exchanger, and the series control mechanism which controls the cooling capacity of the heat exchanger is provided. Therefore, only insufficiency of the cooling capacity in the cooling tower can be supplied by the heat exchanger. Thereby, the cooling tower and the heat exchanger can be efficiently used so that the running cost becomes the minimum in accordance with the cold heat load necessary for condensing the refrigerant gas vaporized in the evaporator. As a result, the running cost can be further reduced.

A sixth aspect of the present invention is, in the fifth aspect, characterized in that the series control mechanism comprises a heat exchanger outlet port sensor which measures a refrigerant temperature and/or refrigerant pressure in the heat exchanger outlet port, a primary refrigerant valve which regulates a refrigerant amount of a primary refrigerant for cooling the refrigerant flowing into the heat exchanger, and a series control part which controls the primary refrigerant valve based on a measurement result of the heat exchanger outlet port sensor, and the series control part controls the primary refrigerant valve so that the measurement result of the heat exchanger outlet port sensor becomes a predetermined value.

Here, the predetermined value refers to the temperature or the pressure necessary for the refrigerant to circulate naturally in the circulation line.

According to the sixth aspect, by conducting control so that the measurement result of the heat exchanger outlet port sensor becomes a predetermined value, the heat amount of the primary refrigerant can be controlled so that only insufficiency of the cooling capacity of the cooling tower is supplied in the heat exchanger when the refrigerant sequentially flows into the heat exchanger from the cooling tower. Accordingly, useless cooling energy is not required in the heat exchanger.

Thereby, the temperature of the outside air which is the cold heat source of the cooling tower can be effectively used irrespective of the summer season, intermediate season, or winter season, and therefore, the running cost can be further reduced.

A seventh aspect of the present invention is, in the fifth or sixth aspect, is characterized in that the series control mechanism comprises a cooling tower outlet port sensor which measures refrigerant temperature and/or refrigerant pressure at the cooling tower outlet port, a bypass line which can feed refrigerant gas returning from the evaporator into the heat exchanger, a bypass valve which regulates a flow rate of refrigerant gas flowing in the bypass line, a regulating valve provided at the cooling tower outlet port, and a series control part which controls the bypass valve and the regulating valve based on a measurement result of the cooling tower outlet port sensor, and the series control part controls the bypass valve and the regulating valve so that the measurement result of the cooling tower outlet port sensor becomes a predetermined value.

Here, the predetermined value refers to the temperature or the pressure necessary for the refrigerant to circulate naturally in the circulation line.

According to the seventh aspect, for example, in the summer season when the outside air temperature rises, and the cooling capacity of the cooling tower reduces, if all the amount of refrigerant gas returning from the evaporator passes through the cooling tower, all the amount of the refrigerant gas cannot be cooled to the temperature and pressure which are necessary for the refrigerant to circulate naturally, and the cooling capacity of the cooling tower which is usable cannot be sufficiently used. However, by operating the bypass valve and the regulating valve so that the measurement result of the cooling tower outlet port sensor becomes a predetermined value, the flow rate of the refrigerant gas which flows into the cooling tower is controlled, and the refrigerant at a predetermined temperature and pressure can be obtained at the cooling tower outlet port. Accordingly, useless cooling energy is not needed in the heat exchanger.

Thereby, the temperature of the outside air which is the cold heat source of the cooling tower can be effectively used irrespective of the summer season, intermediate season, or winter season, and therefore, the running cost can be further reduced.

An eighth aspect of the present invention is, in the sixth or seventh aspect, characterized in that the series control mechanism further comprises an outside air temperature sensor which measures outside air temperature, a bypass line which can feed the refrigerant gas returning from the evaporator into the heat exchanger, and a bypass valve which regulates the flow rate of the refrigerant gas which flows in the bypass line, and the series control part totally closes the regulating valve and totally opens the bypass valve to shut off return of the refrigerant gas to the cooling tower to guide all the refrigerant gas to the heat exchanger, when the measurement result of the outside air temperature sensor reaches a predetermined value or more.

In the eighth aspect, control is conducted by incorporating the outside air temperature into the constitution of the series control mechanism of the sixth or seventh aspect. More specifically, for example, in the summer season when the outside air temperature becomes high and the cooling capacity of the cooling tower reduces the most, the cooling effect of the refrigerant sometimes can be hardly obtained even if the cooling tower is used. At this time, use of both the cooling tower and the heat exchanger becomes a problem from the viewpoint of the running cost. Accordingly, the outside temperature which causes such a problem is grasped in advance, and when the outside air temperature sensor which measures the outside air temperature indicates a predetermined value or more (grasped temperature or more), the regulating valve and the bypass valve are controlled to shut off the flow of the refrigerant gas returning to the cooling tower from the evaporator so that all the refrigerant gas flows into the heat exchanger. Thereby, the running cost, for example, in the summer season when the cooling capacity of the cooling tower reduces the most can be further reduced.

A ninth aspect of the present invention is, in any one of the first to eighth aspects, characterized by further comprising an air-conditioning machine which cools high-temperature air taken in from the device room, and returns the air into the device room, and an air-conditioning circulation line which is branched from the circulation line, and circulates the refrigerant to and from a cooling part of the air-conditioning machine.

According to the ninth aspect, the refrigerant in the circulation line with the running cost for cooling the refrigerant being low is also used as the cold heat source of the air-conditioning machine for cooling the inside of the electronic device room with cold air. Thereby, the running cost for operating the air-conditioning machine can be also reduced.

Further, by using the air-conditioning machine and the evaporator for cooling an electronic device in combination, generation of heat accumulation (local high-temperature regions) in the server room can be suppressed, and the temperature of the supply air from the air-conditioning machine which air-conditions the entire room can be raised in temperature, as compared with the conventional air-conditioning system (the method for performing air-conditioning by circulating the air in the entire electronic device room by air-conditioning with air blown from the floor disclosed in Japanese Patent Application Laid-Open No. 2004-232927). Thereby, in the present invention, higher vaporization (evaporation) temperature of the refrigerant can be adopted as compared with the conventional system, and the capacity of the cooling tower can be sufficiently used. Accordingly, supplying the refrigerant in the circulation line to the cooling part of the air-conditioning machine contributes to both energy saving of the air-conditioning machine and exhibition of the capacity of the cooling tower.

A tenth aspect of the present invention is, in the ninth aspect, is characterized in that the plurality of electronic devices are divided into a plurality of groups, heat exchangers for groups are provided halfway through the circulation line by the number of groups into which the electronic devices are divided, the circulation line is constituted of a main circulation line in which the refrigerant circulates between the cooling tower and/or the heat exchanger and the heat exchangers for a group, and a group circulation line in which the refrigerant circulates between the heat exchangers for groups and the evaporator and/or the cooling part of the air-conditioning machine.

According to the tenth aspect, via the heat exchanger for a group provided at each of the groups into which the electronic devices are divided, the circulation line is constituted of a main circulation line in which the refrigerant circulates between the cooling tower and/or the heat exchanger and the heat exchanger for a group, and a group circulation line in which the refrigerant circulates between the heat exchanger for a group and the evaporator and/or the cooling part of the air-conditioning machine, whereby the operation of the groups can be edge-cut from each other.

Thereby, if abnormality occurs to, for example, the evaporator of one group, or the flow of the refrigerant stops, the abnormality does not affect the other group. Accordingly, occurrence of abnormality to the cooling of all the electronic devices placed in the device rooms can be prevented.

The refrigerants which flow in the main circulation line and the group circulation line may be of the same kind or may be of different kinds.

A eleventh aspect of the present invention is, in any one of claims 1 to 10, characterized by further comprising a flow rate regulating device which is provided in a refrigerant gas flow path at a position of the evaporator outlet port of the circulation line, and regulates a refrigerant flow rate, a temperature sensor which detects temperature of air discharged from the evaporator, and a controller which controls the flow rate regulating device, and characterized in that the controller controls the flow rate regulating device so that the temperature sensor becomes a predetermined value.

According to the eleventh aspect, by controlling the refrigerant flow rate in the refrigerant gas flow path at the evaporator outlet port side, the vaporization (evaporation) temperature of the refrigerant and the refrigerant operation temperature can be made higher as compared with the case of controlling the refrigerant flow rate at the refrigerant liquid flow path side as in the conventional system. Thereby, operation of the vaporization (evaporation) temperature to shift to the high temperature side can be made. Thus, the refrigerant operation temperature is made high, and the heat source temperature can be made high. Accordingly, prevention of reduction in vaporization (evaporation) temperature can be achieved, and therefore, this contributes to prevention of condensation formed in the evaporator.

A twelfth aspect of the present invention is, in any one of the first to eleventh aspects, characterized in that the electronic device is a server, and the device room is a server room.

The present invention can be applied to all the electronic devices which are required to perform precise operations, with a heat generation amount from themselves being large, but a larger effect can be expected, when the electronic device is a server and the device room is a server room.

As described above, according to the cooling system for an electronic device according to the present invention, an electronic device which is required to perform a precise operation, with a heat generation amount from itself being large, such as a computer and a server, can be efficiently cooled at low running cost.

DETAILED DESCRIPTION OF THE PREFERRED EMBODIMENTS

Preferred embodiments of a cooling system for an electronic device according to the present invention will now be described in detail in accordance with the accompanying drawings. As one example of an electronic device, an example of a server placed in a server room will be described.
(First Embodiment)

Figure 1:
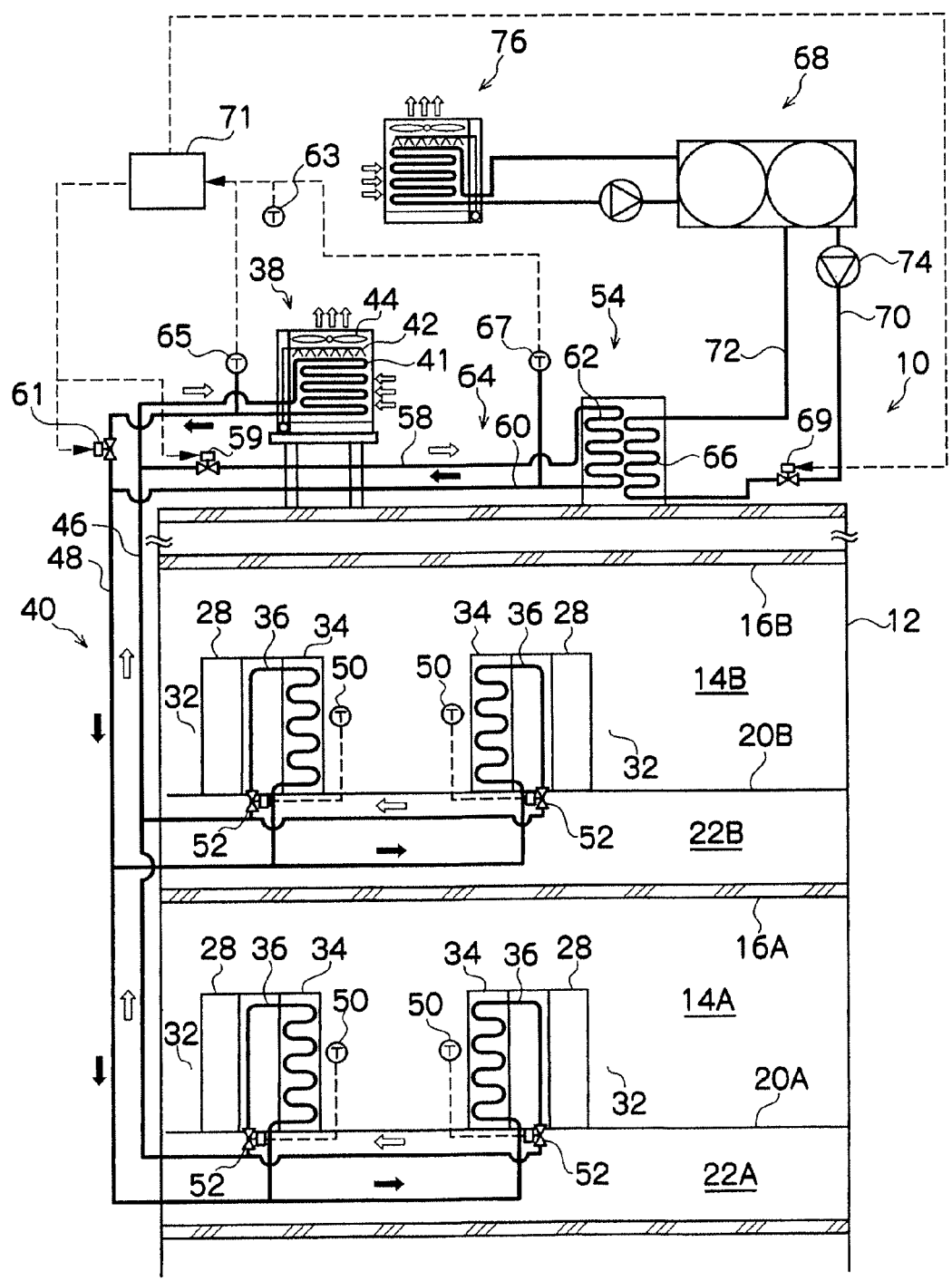
FIG. 1 is a conceptual view explaining a first embodiment of a cooling system for an electronic device of the present invention.

FIG. 1 is a conceptual view showing a cooling system 10 for an electronic device of a first embodiment of the present invention.

As shown in FIG. 1, in a two-storied building 12, server rooms 14A and 14B are formed in a first floor and a second floor respectively. Underfloor chambers 22A and 22B are respectively formed on the back sides of floor surfaces 20A and 20B on the first floor and the second floor. A plurality of air outlet ports (not illustrated) are disposed in the floor surfaces 20A and 20B. Cold air from air-conditioning machines 78 (see FIG. 3) which will be described later is blown into the server rooms 14A and 14B from the floor surfaces 20A and 20B through the underfloor chambers 22A and 22B. The air outlet ports are preferably disposed in the vicinity of the front surface side of each of servers 28, and the cold air blown from them is supplied to the servers 28, whereby the servers 28 can be efficiently cooled.

Figure 2:
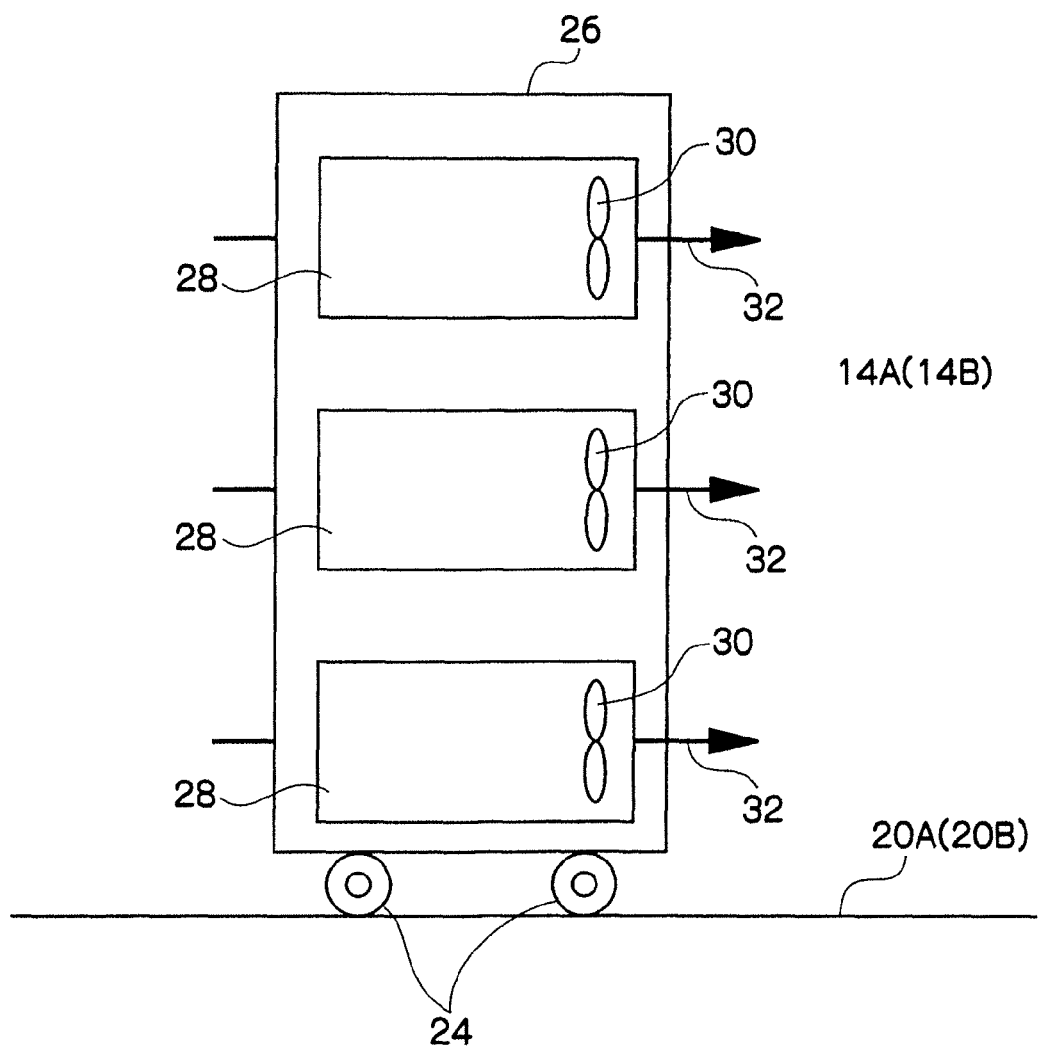
FIG. 2 is an explanatory view explaining a server and a server rack.

As shown in FIG. 2, server racks 26 are placed in the server rooms 14A and 14B, and a plurality of severs 28 are stored in the server racks 26 in the state stacked in layer. The server rack 26 is preferably disposed to be movable by being provided with moving casters 24. The server 28 is equipped with a fan 30, and by taking in the air of the server rooms 14A and 14B and discharging the air as shown by the arrow 32, the heat which generates in the server 28 is discharged from the server 28. The two-storied building 12 shown in FIG. 1, the numbers of the server rooms 14A and 14B, the number of the server racks 26 placed in the server rooms 14A and 14B, the number of the servers 28 stacked in layer on the server rack 26 and the like are only examples, and they are not limited to the numbers in FIGS. 1 and 2. Further, as shown in FIG. 1, an evaporator 34 is provided at each of the servers 28 stored in the server rack 26. In FIG. 1, in order to make the relation of the server 28 and the evaporator 34 understandable, it is shown with the server 28 instead of the server rack 26.

As shown in FIG. 1, a cooling coil 36 is provided inside the evaporator 34. A refrigerant liquid flowing in the cooling coil 36 evaporates due to high-temperature air generating from the server 28, and thereby, takes vaporization heat from the periphery to be gasified. Thereby, the server 28 itself and high-temperature air discharged from the server 28 are cooled.

Meanwhile, a cooling tower 38 is provided on the roof of the building 12, and a circulation line 40 in which the refrigerant naturally circulates is formed between the cooling tower 38 and the aforementioned respective evaporators 34. More specifically, spiral piping 41 in which the refrigerant flows is stored in the cooling tower 38, and a sprinkling pipe 42 which sprinkles water to the spiral piping 41 is provided above the spiral piping 41. Further, a fan 44 is provided above the sprinkling pipe 42, and outside air is taken in from a side surface opening of the cooling tower 38 and discharged from a top surface opening, whereby a counter current of the sprinkled water and the outside air taken therein is formed, and thereby, the outside air is cooled so that the temperature becomes lower than the intake air temperature.

The cooling coil 36 provided in the evaporator 34 and the spiral piping 41 provided in the cooling tower 38 are connected by return piping 46 (refrigerant gas piping) for returning the refrigerant gas which is gasified in the evaporator 34 to the cooling tower 38, and supply piping 48 (refrigerant liquid piping) for supplying the refrigerant liquid which is liquefied by cooling and condensing the refrigerant gas in the cooling tower 38 to the evaporator 34.

The return piping 46 and the supply piping 48 branch out halfway, and pass through the underfloor chambers 22A and 22B on the first floor and the second floor to be connected to the evaporators 34 of the servers 28 placed in the server room 14A on the first floor and the evaporators 34 of the servers 28 placed in the server room 14B on the second floor. In such a constitution, by a rapid increase in the heat generation amount from the servers 28 in recent years, high-temperature heat generated (discharged) from the servers 28 is directly exchanged with the refrigerant flowing in the evaporators 34 as the heat is in the high-temperature state to promote evaporation of the refrigerant gas, and thereby transport power for transporting the vaporized refrigerant gas to the cooling tower 38 placed at a higher place than the evaporator 34 can be obtained. As the refrigerant for use, chlorofluorocarbon, or HFC (hydrofluorocarbon) as an alternative CFC and the like can be used. Further, when used at a pressure lower than the atmospheric pressure, water can be used. Here, expression of the refrigerant includes both refrigerant gas in a gaseous state, and a refrigerant liquid in a liquid state, and in FIG. 1, the flow direction of the refrigerant gas is shown by the white arrow, and the flow direction of the refrigerant liquid is shown by the black arrow.

Thereby, the circulation line 40 for naturally circulating the refrigerant is formed between the evaporator 34 and the cooling tower 38. More specifically, a heat pipe with no power in which the refrigerant is sealed is constructed by the evaporator 34, the cooling tower 38 and the circulation line 40. Further, since the heat generation amount from the server 28 becomes large and refrigerant gas at a high temperature can be formed, the cooling temperature for condensing the refrigerant gas can be set to be high, and the refrigerant gas can be condensed with the cooling capacity by the cooling tower 38. The condensed refrigerant liquid flows down to the evaporator 34 located below the cooling tower 38.

Further, each of the evaporators 34 is provided with a temperature sensor 50 which measures the temperature of the air after the high-temperature air discharged from the server 28 is cooled with the evaporator 34, and a valve 52 (flow regulating device) for regulating the supply flow rate (refrigerant flow rate) of the refrigerant which is supplied to the cooling coil 36 is provided at an outlet port of the cooling coil 36. A controller not illustrated automatically regulates the opening degree of the valve 52 based on the measured temperature by the temperature sensor 50. Thereby, when the temperature of the air after cooled in the evaporator 34 becomes excessively lower than the set temperature, the opening degree of the valve 52 is reduced and the supply flow rate of the refrigerant is reduced. By controlling the supply flow rate of the refrigerant not to increase to be more than necessary like this, the cooling load for cooling the refrigerant can be made small, and therefore, sufficient cooling capacity can be exhibited with only cooling in the cooling tower 38.

Describing this in more detail, in the servers 28, the air in the server rooms 14A and 14B is taken into the servers by the fans 30, and the air is heated. Heat exchange is performed between the heated high-temperature air and the evaporators 34, and the temperature of the cooled air is measured by the temperature sensors 50.

Meanwhile, in the refrigerant natural circulation system, the condensing temperature which is lower than the vaporization (evaporation) temperature is required, unlike the conventional compression type air-conditioning system. Therefore, if the vaporization temperature can be set to be high, the condensing temperature, namely, the temperature of the outside air used in the cooling tower 38 can be made high, and the cooling capacity in the cooling tower 38 can be used under the outside air condition at a higher temperature. More specifically, in the intermediate seasons (spring season and autumn season) in which the outside air temperature is relatively high, cooling with only the cooling tower is also made possible, and running cost can be reduced by suppressing the operation of a refrigerator 68.

Further, on the roof of the building 12, a heat exchanger 54 having cooling capacity larger than the cooling tower 38 is installed in addition to the cooling tower 38, and the heat exchanger 54 is provided in a parallel line 64 branched from the circulation line 40. More specifically, as shown in FIG. 1, parallel return piping 58 and parallel supply piping 60 which are branched from the return piping 46 and the supply piping 48 respectively are connected to a secondary side coil 62 of the heat exchanger 54. Thereby, the heat exchanger 54 is disposed to have parallel relation in the flow of the refrigerant with respect to the cooling tower 38.

Further, a primary side coil 66 of the heat exchanger 54 is connected to cooling water supply piping 70 and cooling water return piping 72 from the refrigerator 68, and the cooling water supply piping 70 is provided with a delivery pump 74. Thereby, the cooling water (primary refrigerant) produced in the refrigerator 68 exchanges heat with the refrigerant (secondary refrigerant) in the heat exchanger 54, and cools the refrigerant. The working electric power for the refrigerator 68 can be reduced by connecting the refrigerator 68 to a cooling tower 76 different from the above described cooling tower 38 and using it as a cold heat source of the refrigerator 68. The structure of the cooling tower 76 is the same as that of the above described cooling tower 38.

The parallel return piping 58 is provided with a parallel valve 59, a shut-off valve 61 is provided in the vicinity of the cooling tower 38 in the supply line 48, and the cooling water supply piping 70 in which cooling water flows is also provided with a valve 69. Meanwhile, an outside air temperature sensor 63 which measures the outside air temperature is provided in the vicinity of the cooling tower 38, and temperature sensors 65 and 67 are provided at a cooling tower outlet port (refrigerant liquid side) and a heat exchanger outlet port (refrigerant liquid side). The measurement results of the respective temperature sensors 63, 65 and 67 are sequentially input in a parallel control part 71, and the parallel control part 71 controls the respective valves 59, 61 and 69 based on the measurement result. Thereby, the parallel control mechanism is formed. The temperature sensors 65 and 67 are provided at the cooling tower outlet port and the heat exchanger outlet port, but pressure sensors (not illustrated) which measure the pressure of the refrigerant flowing in the piping can be provided, and both the liquid temperature sensors 65 and 67 and the pressure sensors may be provided.

Here, a preferable mode of a control method by the parallel control mechanism will be described.

In the first control method, the parallel control part 71 calculates the capacity to cool the refrigerant in the cooling tower 38 from the measurement result of the outside temperature sensor 63, and regulates the opening degree amount of the parallel valve 59 from the calculation result, whereby the parallel control part 71 controls the refrigerant amount to be fed to the heat exchanger 54. Thereby, the cooling tower 38 and the heat exchanger 54 can be efficiently used so that the running cost becomes the minimum in accordance with the cooling load necessary for condensing the refrigerant gas vaporized in the evaporator 34.

The cooling capacity of the cooling tower 38 significantly depends on the outside air temperature, and therefore, by conducting the control as described above, a part of the refrigerant flowing in the circulation line 40 can be caused to flow into the heat exchanger 54 automatically in accordance with the variation in the outside air temperature. Therefore, only insufficiency of the cooling capacity of the cooling tower 38 needs to be supplied by the heat exchanger 54. Thereby, the running cost can be further reduced.

Further, in the second control method, the parallel control part 71 regulates the opening degree amount of the parallel valve 59 so that the measurement result of the temperature sensor 65 at the outlet port of the cooling tower becomes a predetermined value and controls the refrigerant amount to be fed to the heat exchanger 54. Thereby, by measuring the refrigerant temperature at the outlet port of the cooling tower, the cooling capacity which the cooling tower 38 has at the point of time of measurement can be grasped. Accordingly, a part of the refrigerant flowing in the circulation line 40 can be automatically caused to flow in the heat exchanger 54 by automatically regulating the opening degree amount of the parallel valve 59 based on the measurement result, and therefore, only insufficiency of the cooling capacity of the cooling tower 38 needs to be supplied by the heat exchanger 54. Thereby, the running cost can be further reduced.

Further, when these control methods are carried out, the temperature sensor 67 provided at the outlet port of the heat exchanger is measured, and thereby, the temperature of the refrigerant to be supplied to the evaporators 34 can be known. Accordingly, by controlling the opening degree amount of the valve 69 of the cooling water supply piping 70 based on the measurement result, the refrigerant can be prevented from being cooled more than necessary in the heat exchanger 54. Further, in the summer season when the cooling capacity of the cooling tower 38 reduces the most, combined use of the cooling tower 38 and the heat exchanger 54 sometimes becomes a disadvantage from the viewpoint of the running cost. Thus, in such a case, by closing the shut-off valve 61 when the measurement temperature of the outside temperature sensor 63 reaches a predetermined value or higher, the running cost can be further reduced.

The two cooling devices that are the cooling tower 38 and the heat exchangers 54 are included, and each of them bears each share of work like this. Thereby, stable operation of the cooling system can be guaranteed, and the running cost for cooling the refrigerant can be reduced.

(Second Embodiment)

Figure 3:
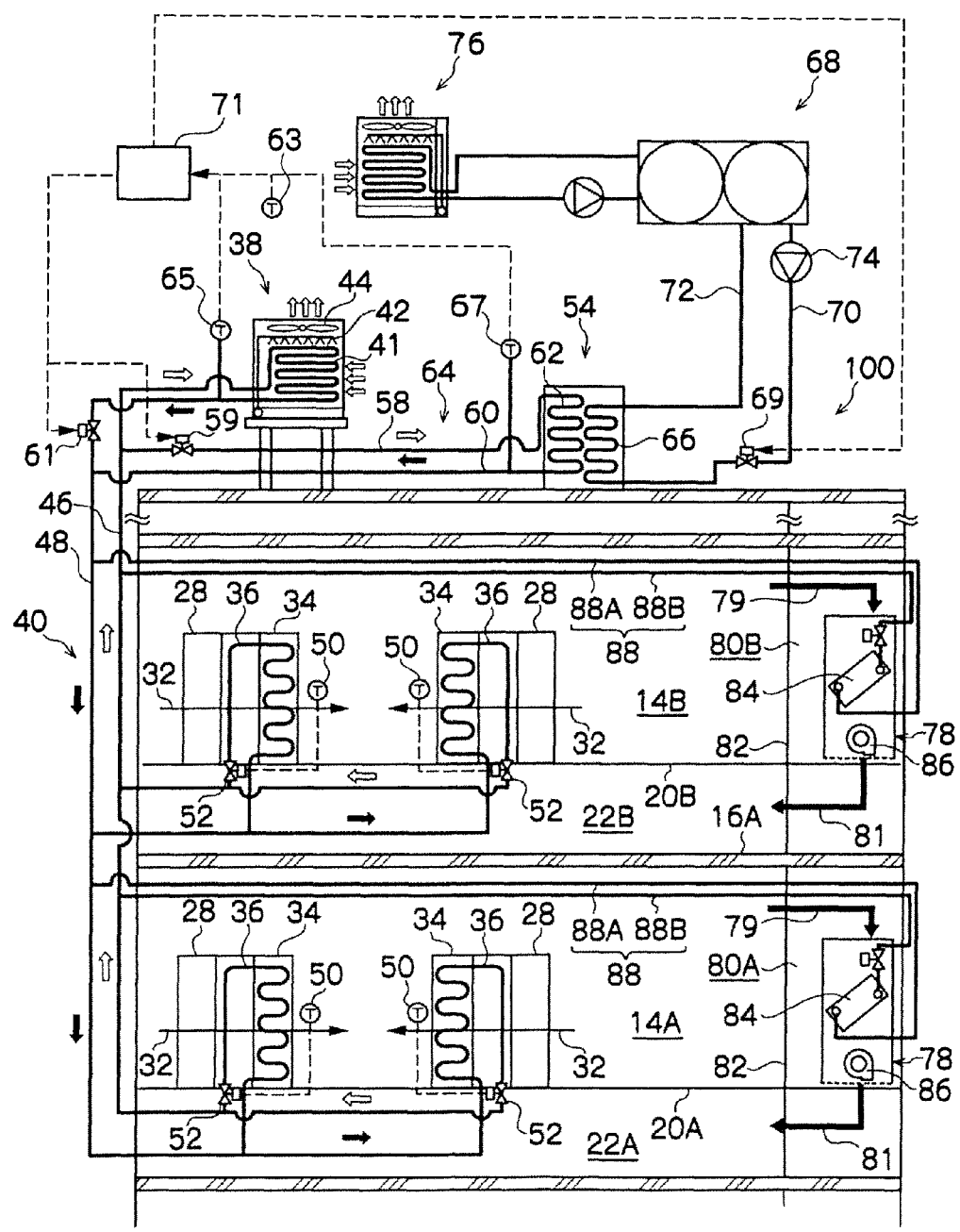
FIG. 3 is a conceptual view explaining a second embodiment of the cooling system for an electronic device of the present invention.

FIG. 3 is a conceptual view showing a cooling system 100 for an electronic device of a second embodiment of the present invention. The same members and constitutions as those in the first embodiment will be omitted.

In the cooling system 100 of the second embodiment, an air-conditioning machine 78 for cooling server rooms 14A and 14B is provided in the constitution of the cooling system 10 of the first embodiment, and the refrigerant of the circulation line 40 is used as a cold heat source of the air-conditioning machine 78.

More specifically, as shown in FIG. 3, machine rooms 80A and 80B are respectively provided adjacently to the server rooms 14A and 14B, and the air-conditioning machines 78 are installed in the machine rooms 80A and 80B, respectively. Further, inlet ducts 79 which take the air of the server rooms 14A and 14B into the air-conditioning machine 78 via the machine rooms 80A and 80B are placed by being penetrated through partition walls 82 which partition the server rooms 14A and 14B and the machine rooms 80A and 80B, and one end of the inlet duct 79 is connected to a cooling part 84 of the air-conditioning machine 78. Further, one end of an outlet duct 81 is connected to an air blower 86 of the air-conditioning machine, and the other end is extensively provided in each of underfloor chambers 22A and 22B through the partition wall 82. Thereby, the air taken into each of the air-conditioning machines 78 via each of the intake ducts 79 is cooled by each of the cooling parts 84 of each of the air-conditioning machines 78, and blown into each of the underfloor chambers 22A and 22B via each of the outlet ducts 81 by each of the air blowers 86. Subsequently, the air is blown out to each of the server rooms 14A and 14B from floor surfaces 20A and 20B. In this case, the air outlets (not illustrated) of the floor surfaces 20A and 20B are preferably formed so that cooling air is blown to the vicinity of the front surface of the server 28. The front surface of the server 28 means the opposite side of the evaporator 34.

Further, the cooling part 84 of the air-conditioning machine 78 is connected to an air-conditioning circulation line 88 branched from the circulation line 40. More specifically, air-conditioning supply piping 88A and air-conditioning return piping 88B which constitute the air-conditioning circulation line 88 are connected to the cooling part 84 of the air-conditioning machine 78.

According to the cooling system of the second embodiment constituted as described above, the following effect can be exhibited in addition to the effect of the above described first embodiment.

More specifically, the refrigerant of the circulation line 40 of which running cost for cooling the refrigerant is low is used as the cold heat source of the air-conditioning machine 78 for cooling the server rooms 14A and 14B with cold air. Thereby, the running cost for operating the air-conditioning machine 78 also can be reduced. Further, by using the air-conditioning machine 78 and the evaporator 34 for cooling the server 28 in combination, generation of heat accumulation (local high-temperature regions) in the server rooms 14A and 14B can be suppressed, and the supply air temperature from the air-conditioning machine 78 which air-conditions the entire server room can be raised, as compared with the conventional air-conditioning system (the method for air-conditioning by circulating air in the entire electronic equipment room by air-conditioning with the air blown from the floor shown in Japanese Patent Application Laid-Open No. 2004-232927). Thereby, in the present invention, vaporization (evaporation) temperature of the refrigerant can be made high as compared with the conventional system, and the capacity of the cooling tower 38 can be sufficiently used.

Accordingly, supplying the refrigerant of the circulation line 40 to the cooling part 84 of the air-conditioning machine 78 contributes to both energy saving of the air-conditioning machine 78 and exhibition of the capacity of the cooling tower 38.

(Third Embodiment)

Figure 4:
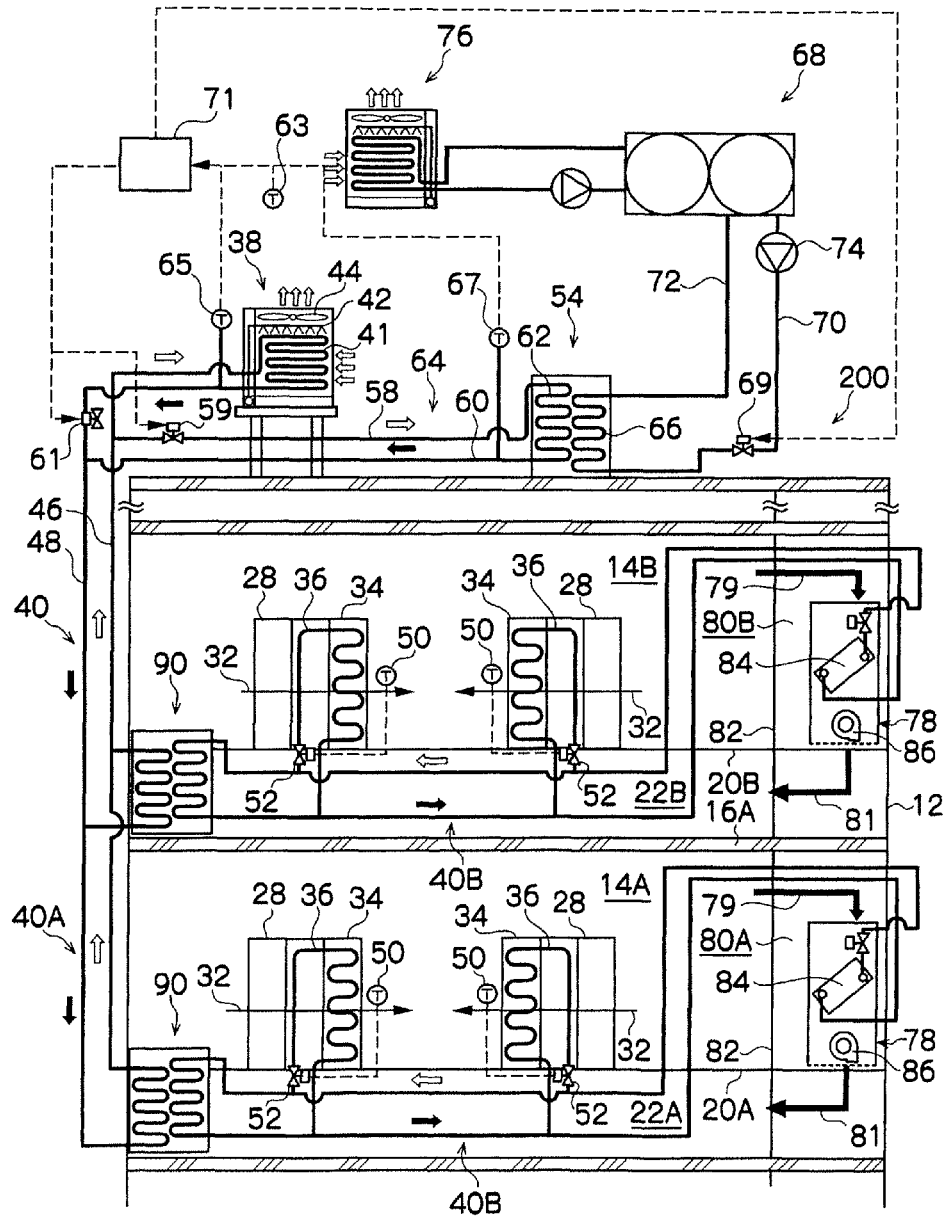
FIG. 4 is a conceptual view explaining a third embodiment of the cooling system for an electronic device of the present invention.

FIG. 4 is a conceptual view showing a cooling system 200 for an electric device of a third embodiment of the present invention. Explanation of the same members and constitutions as those in the second embodiment will be omitted.

The cooling system 200 of the third embodiment has the constitution in which a plurality of servers 28 equipped with the evaporators 34 are divided into groups, and thereby, the cooling system 200 can be operated with the groups being edge-cut from each other, in addition to the constitution of the cooling system 100 of the second embodiment.

More specifically, as shown in FIG. 4, a plurality of the servers 28 equipped with the evaporators 34 are divided into a plurality of groups. In the case of FIG. 4, the servers 28 installed in the server room 14A on the first floor are grouped as one group, and the servers 28 installed in the server room 14B on the second floor are grouped as another group. The method for grouping is not limited to the above description, and the servers 28 can be further divided into small groups.

Two of heat exchangers 90 for groups, which is the number of groups into which the servers 28 are divided, are provided halfway in the circulation line 40, and the circulation line 40 is constituted of a main circulation line 40A in which the refrigerant circulates between the cooling tower 38 and/or the heat exchanger 54, and the heat exchanger 90 for a group, and a group circulation line 40B in which the refrigerant circulates between the heat exchanger 90 for a group and the evaporator 34.

Further, in the second embodiment, as the cold heat source of the air-conditioning machine 78, the refrigerant flowing in the circulation line 40 is directly supplied to the cooling part 84 of the air-conditioning machine 78, but in the third embodiment, the air-conditioning machines 78 are divided into two groups of the air-conditioning machine 78 installed in the machine room 80A on the first floor, and the air-conditioning machine 78 installed in the machine room 80B on the second floor. The group circulation lines 40B corresponding to the groups are connected to the cooling parts 84 of the respective air-conditioning machines 78.

According to the cooling system 200 of the third embodiment constituted as described above, the following effect can be exhibited in addition to the effect of the second embodiment described above.

More specifically, if abnormality occurs to, for example, the evaporator 34 of one group, or the flow of the refrigerant stops, the abnormality does not affect the other group. Accordingly, occurrence of abnormality to cooling of all the servers 28 placed in the server rooms 14A and 14B can be prevented. Further, by also grouping the air-conditioning machines 78, even if abnormality such as stoppage of the flow of the refrigerant occurs in one group, the abnormality does not affect the cooling parts 84 of the air-conditioning machines 78 of the other group.

(Fourth Embodiment)

Figure 5:
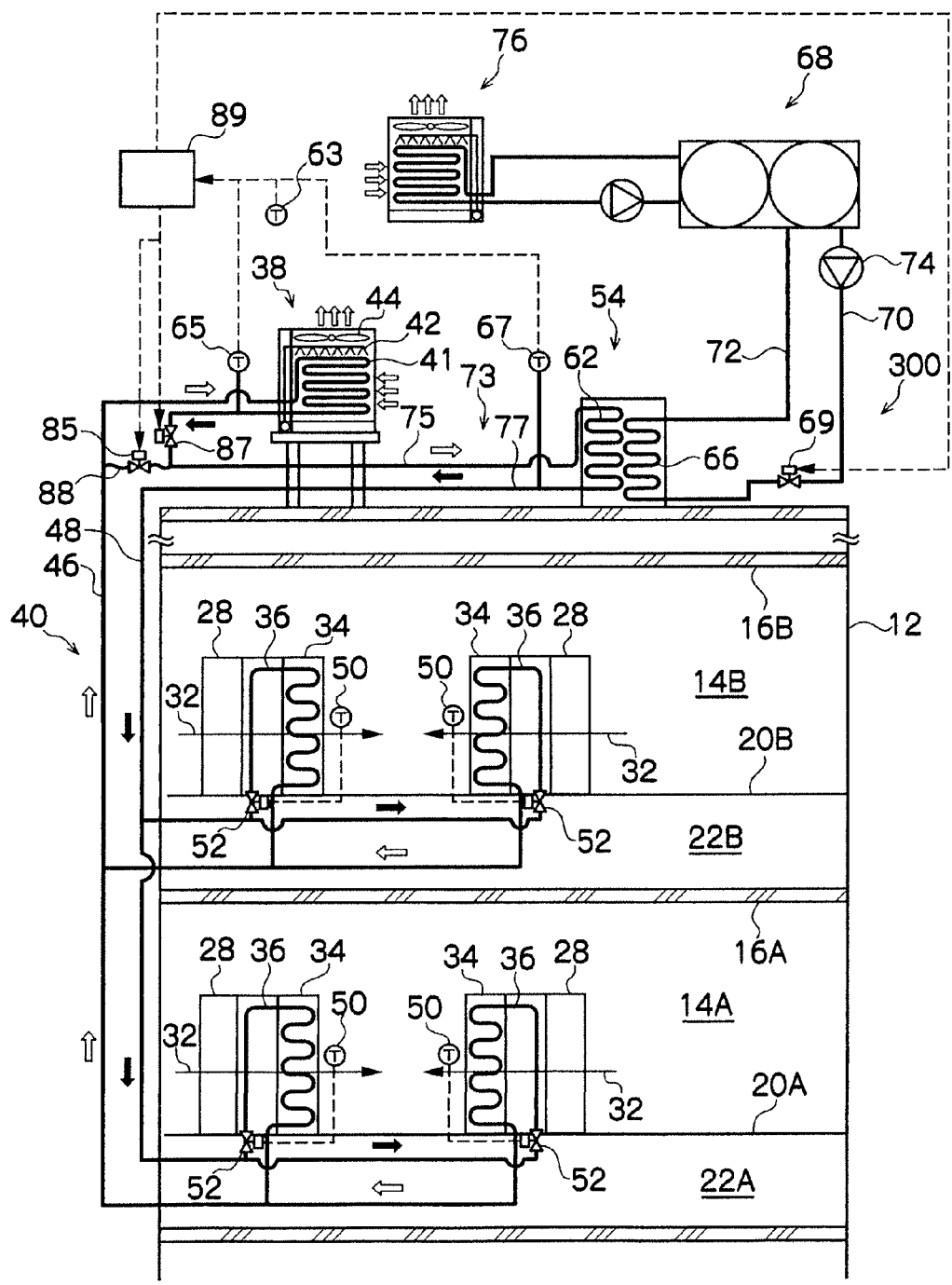
FIG. 5 is a conceptual view explaining a fourth embodiment of the cooling system for an electronic device of the present invention.

FIG. 5 is a conceptual view of a cooling system 300 for an electronic device of a fourth embodiment of the present invention, and is a view made by changing FIG. 1 so that the cooling tower 38 and the heat exchanger 54 are in series positional relation. As in the first embodiment, the case in which the cooling tower 38 and the heat exchanger 54 are installed so as to be in parallel positional relation is described, the redundant parts are omitted, and the same members and constitutions are described by being assigned with the same reference numerals and characters.

As shown in FIG. 5, the refrigerant gas which is vaporized in the evaporator 34 reaches the cooling tower 38 via the return piping 46 of the circulation line 40, where the refrigerant is cooled and becomes a refrigerant liquid, and thereafter, the refrigerant flows into the heat exchanger 54 via return piping 75 of a series line 73. In the heat exchanger 54, the refrigerant liquid further cooled by heat exchange with the primary refrigerant (cooling water) flows into the supply piping 48 of the circulation line 40 via outward piping 77 of the series line 73. Thereby, the heat exchanger 54 is disposed in the series relation with respect to the cooling tower 38 in the flow of the refrigerant.

Further, a valve 69 and a regulating valve 87 are provided in the cooling water supply piping 70 and the cooling tower outlet port, the outside air temperature sensor 63 is provided near the cooling tower 38, and the temperature sensors 65 and 67 are provided at the cooling tower outlet port and the heat exchanger outlet port, respectively. Further, a bypass line 83 which can pass the refrigerant gas returning from the evaporator 34 into the heat exchanger 54 is provided, and a bypass valve 85 is provided in the bypass line 83. In order to distinguish the bypass line 83 and the series line described above, the bypass line 83 is written to be in a wavy shape in FIG. 5. The measurement results of the respective temperature sensors 63, 65 and 67 are input in a series control part 89, and the series control part 89 controls the respective valves 69, 85 and 87 based on the measurement results. Thereby, the series control mechanism is formed. In FIG. 5, the temperature sensors 65 and 67 are disposed at the cooling tower outlet port and the heat exchanger outlet port respectively, but the pressure sensor which measures the pressure of the refrigerant flowing in the piping can be provided, and both the temperature sensors and the pressure sensors may be provided.

Here, a preferable mode of a control method according to the series control mechanism will be described.

Though the cooling load on the heat exchanger 54 becomes large in the summer season when the cooling capacity of the cooling tower 38 reduces, the series control part 89 conducts control so that the measurement result at the heat exchanger outlet sensor becomes a predetermined value, and thereby, the series control part 89 can control the heat amount of the primary refrigerant so that only insufficiency of the cooling capacity of the cooling tower 38 is supplied in the heat exchanger 54 when the refrigerant sequentially flows into the heat exchanger 54 from the cooling tower 38. Accordingly, unnecessary cooling energy is not required in the heat exchanger 54.

Further, the cooling capacity of the cooling tower 38 varies depending on the outside air temperature, and therefore, when the refrigerant amount flowing in the spiral piping 41 in the cooling tower 38 is too large in the summer season and intermediate season, the refrigerant sometimes cannot be cooled to the temperature required for naturally circulating the refrigerant. Accordingly, the refrigerant gas flow rate to the cooling tower 38 is controlled by operating the opening degrees of the bypass valve 85 provided in the bypass line and the regulating valve 87 provided in the outlet port of the cooling tower so that the measurement result of the temperature sensor 65 at the outlet port of the cooling tower is controlled to be a predetermined value. Thereby, the temperature of the outside air which is the cold heat source of the cooling tower 38 can be effectively used irrespective of a summer season, intermediate seasons or a winter season, and therefore, the running cost can be further reduced.

Here, the predetermined value refers to the temperature or pressure required for naturally circulating the refrigerant in the circulation line.

Thus, in the fourth embodiment of the invention of the present application, even when the cooling tower 38 and the heat exchanger 54 are disposed in series, only the insufficiency of cooling of the cooling tower 38 has to be supplied in the heat exchanger 54 by firstly cooling the refrigerant gas returning from the evaporator 34 in the cooling tower 38, and then passing the refrigerant through the heat exchanger 54, and cold heat of outside air can be effectively used in the cooling tower 38 throughout a year.

As a more preferable mode of the series control mechanism, the series control part 89 fully closes the regulating valve 87 and fully opens the bypass valve 85 so as to shut off the return of the refrigerant gas to the cooling tower 38 from the evaporator 34 and guide all the refrigerant gas to the heat exchanger 54, when the measurement result of the outside air temperature sensor 63 reaches a predetermined value or more in a summer season. Thereby, the running cost in the summer season can be further reduced.

The above described second embodiment or third embodiment can be combined with the constitution of the fourth embodiment in which the cooling tower 38 and the heat exchanger 54 are disposed in series.

SUMMARY OF THE PRESENT INVENTION

According to the cooling system for an electronic device of the present invention, an electronic device required to perform a precise operation with an amount of heat generation from itself being large, such as a computer and a server, can be efficiently cooled at low running cost.

(A) By adopting the refrigerant natural circulation method, and using the difference of elevation of the disposed positions and the treatment temperature difference between the evaporator 34 and the cooling tower 38, transfer power for the refrigerant (heat) is not needed. In the refrigerant natural circulation method, when a difference $\Delta T$ between the temperature of the air which is discharged from the evaporator 34, and is measured by the temperature sensor 50, and the air temperature at which the refrigerant is cooled in the cooling tower 38 is 5° C. or higher, the system operates, and the refrigerant can be transferred without power. In the cooling system of the conventional central air-conditioning method, about 10% of the total power required by the system is occupied by the pump power which transfers the refrigerant, and the pump power required for the refrigerant transfer (also called heat transfer) can be reduced.

Further, as a result that the heat generation amount from the server 28 in recent years has abruptly increased, and heat at a high temperature (high-temperature air) generates from the server 28, the above described $\Delta T$ increases more than ever. Thus, with increase in the $\Delta T$, the heat transfer amount (heat treatment amount of the system) increases. The heat transfer amount changes in accordance with the specifications of the heat exchanger 54, but with $\Delta T=15°$ C., cooling of about a half of the server heat generation amount (with $\Delta T=30°$ C., the total heat generation amount of the server) is possible (when the server heat generation is 15 kW, heat treatment of 7.5 kW with $\Delta T=15°$ C. is possible, and heat treatment of all of 15 kW is possible with $\Delta T=30°$ C.). The server rack exhaust (air temperature at the side of the evaporator) is normally at about 40° C. When the outside air temperature is 25° C. (corresponding to $\Delta T=15°$ C.) or lower, a half of the server heat generation can be cooled with only the outside air, and when the outside air temperature is 10° (corresponding to $\Delta T=30°$ C.) or lower, the total amount of the server heat generation can be treated with the outside air. For example, the number of hours when the outside air temperature is 10° C. or lower is about 2600 hours (about 30% of the total number of hours) in Tokyo, and if the operation using the outside air cold heat is performed only when at the outside air temperature of 10° C. or lower, the heat load on the heat source can be reduced more than the conventional systems by 30%. Further, the number of hours when the outside air temperature is 10° C. to 25° C. is about 40% of the total number of hours, and if 50% of the total server heat generation is treated with the outside air by also using the outside air during this season (intermediate seasons), the heat load of the heat source can be reduced more than the conventional systems by 50%.

(B) By adopting the cooling tower 38 for cooling the refrigerant gas, and effectively using cold heat which low-temperature outside air in a winter season and intermediate seasons (spring and autumn) has, the cooling heat amount which is produced by the heat source facility (in the conventional system, the compressor of a package air conditioner) can be reduced. In fact, the efficiency of the conventional package air conditioner: COP [cold heat amount to be produced (kW)/Input power amount (kW)] is 2 to 2.5, but COP is 30 or more in the cooling by using outside air of the present invention.

(C) By locally cooling each server 28 by using the evaporator 34 close to the server 28, local heat accumulation can be prevented.

For example, in a data processing center facility, the air temperature conditions under which the server mounted on the server rack normally operates are specified, and intake air condition is generally 25° C. or lower though it depends on the server.

Meanwhile, the conventional air conditioning of a method of blowing air from the floor is operated with the temperature of the supply air from the package air-conditioning machine at about 18° C., and the temperature of the return air to the air-conditioning machine at about 26° C. This is because in the actual operation, server rack exhaust air (normally at about 40° C.) and supply air are partially mixed and are taken into the server rack, and therefore, in order to satisfy the server rack intake air temperature of 25° C., the supply air temperature has to be low (actual air temperature is about 18° C.).

In contrast to this, when the server rack is cooled with the local heat treatment unit method, the outlet port air temperature of 25° C. is satisfied. Therefore, even if the supply air temperature is not low, namely, is higher than 18° C., the server intake air temperature of 25° C. can be satisfied, and when, for example, the supply air temperature of 23° C. and the conventional temperature of 18° C. are compared, the temperature can be increased by 5° C. Generally, in the cooling system of the package air-conditioning method, the above described efficiency (COP) can be increased by about 3% by increasing the supply air temperature by 1° C., and by increase of the supply air temperature by 5° C., the COP can be increased by about 15%.

For prevention of heat accumulation by such local cooling, the influence of the heat accumulation on an electronic device such as the server 28 is conventionally prevented by reducing the temperature of the air-conditioning air which is supplied to the server rooms 14A and 14B from the air-conditioning machine 78. However, when the supply air temperature is reduced like this, the temperature of the refrigerant gas which is vaporized in the evaporator 34 becomes too low. As a result, the set temperature of the refrigerant device which cools and condenses the refrigerant gas has to be made low, and the cooling device having a cooling capacity which is not so large, such as the cooling tower 38 cannot be used.

In contrast to this, in the present invention, by supplying the refrigerant which is cooled in the cooling tower 38 to the cooling part 84 of the air-conditioning machine 78, the supply air temperature can be prevented from becoming too low, and therefore, the cooling device having a cooling capacity which is not so large, such as the cooling tower 38 can be used. Further, as a result that the supply air temperature can be increased, the COP of the entire cooling system can be increased. In this case, even with the constitution in which the refrigerant which is cooled in the cooling tower 38 is supplied to the cooling part 84 of the air-conditioning machine 78, heat accumulation can be sufficiently prevented, and no problem arises.

Further, in the present invention, the cooling tower 38 is disposed above the evaporator 34 to circulate the refrigerant naturally, but the refrigerant can be transferred with refrigerant pumps instead of being naturally circulated by providing the refrigerant pumps not illustrated in the supply piping 48 of the circulation line 40 and the branched supply piping 60, for example. Thereby, in the positional relation of the evaporator 34 and the cooling tower 38, the cooling tower 38 does not have to be disposed above the evaporator 34, and the evaporator 34 and the cooling tower 38 can be freely disposed without limitation on the disposition of the evaporator 34 and the cooling tower 38.

The cooling systems 10, 100 and 200 in the above described first to third embodiments are described with the example of the server 26 as an electronic device, but the present invention can be applied to all electronic devices which are required to perform precise operations with the heat generation amount from itself being large.

What is claimed is:

1. A cooling system for an electronic device, comprising:
    an evaporator that cools exhaust air from the electronic device by vaporizing a refrigerant with heat generated from the electronic device;
    a cooling tower which is provided at a place higher than the evaporator, cools the refrigerant and condenses the vaporized refrigerant;
    a circulation line in which the refrigerant naturally circulates between the evaporator and the cooling tower
    a heat exchanger which cools the refrigerant
    a parallel line which is a flow path for the refrigerant, connected to the circulation line, and which produces a parallel relationship between the heat exchanger and the cooling tower, and
    a parallel control mechanism which controls an amount of refrigerant which is fed to the parallel line from the circulation line.

2. The cooling system for an electronic device according to claim 1, wherein
    the parallel control mechanism comprises
    an outside air temperature sensor which measures outside temperature,
    a parallel valve which is provided in the parallel line, and regulates an amount of the refrigerant which is refrigerant gas returning from the evaporator and flowing into the heat exchanger, and
    a parallel control part which calculates capacity of cooling the refrigerant in the cooling tower from a measurement result of the outside air temperature sensor, and regulates an opening degree amount of the parallel valve from a result of the calculation to control a refrigerant amount which is fed to the heat exchanger.

3. The cooling system for an electronic device according to claim 1, wherein
    the parallel control mechanism comprises
    a cooling tower outlet port sensor which measures at least one of refrigerant temperature and refrigerant pressure at an outlet port of the cooling tower,
    a parallel valve which is provided in the parallel line and regulates an amount of the refrigerant which is refrigerant gas returning from the evaporator and flowing into the heat exchanger, and
    a parallel control part which regulates an opening degree amount of the parallel valve so that a measurement result of the cooling tower outlet port sensor becomes a predetermined value to control an amount of refrigerant which is fed to the heat exchanger.

4. A cooling system for an electronic device, comprising:
    an evaporator which cools exhaust air form the electronic device by vaporizing a refrigerant with heat generating from the electronic device;
    a cooling tower which is provided at a place higher than the evaporator, cools the refrigerant and condenses the vaporized refrigerant;
    a circulation line in which the refrigerant naturally circulates between the evaporator and the cooling tower;
    a heat exchanger which cools the refrigerant;
    a series line which is a flow path for the refrigerant, connected to the circulation line, and which produces a series relationship with respect to the cooling tower, the series line being arranged to cause the refrigerant returning from the evaporator to reach the heat exchanger after passing through the cooling tower; and
    a series control mechanism which controls cooling capacity of the heat exchanger.

5. The cooling system for an electronic device according to claim 4, wherein
    the series control mechanism comprises
    a heat exchanger outlet port sensor which measures a refrigerant temperature and/or refrigerant pressure in the heat exchanger outlet port,
    a primary refrigerant valve which regulates a refrigerant amount of a primary refrigerant for cooling the refrigerant flowing into the heat exchanger, and
    a series control part which controls the primary refrigerant valve based on a measurement result of the heat exchanger outlet port sensor,
    wherein the series control part controls the primary refrigerant valve so that the measurement result of the heat exchanger outlet port sensor becomes a predetermined value.

6. The cooling system for an electronic device according to claim 4,
    wherein the series control mechanism comprises
    a cooling tower outlet port sensor which measures refrigerant temperature and/or refrigerant pressure at the cooling tower outlet port,
    a bypass line which can feed refrigerant gas returning from the evaporator into the heat exchanger,
    a bypass valve which regulates a flow rate of refrigerant gas flowing in the bypass line,
    a regulating valve provided at the cooling tower outlet port, and
    a series control part which controls the bypass valve and the regulating valve based on a measurement result of the cooling tower outlet port sensor,
    wherein the series control part controls the bypass valve and the regulating valve so that the measurement result of the cooling tower outlet port sensor becomes a predetermined value.

7. The cooling system for an electronic device according to claim 4,
wherein the series control mechanism comprises
a cooling tower outlet port sensor which measures refrigerant temperature and/or refrigerant pressure at the cooling tower outlet port,
a bypass line which can feed refrigerant gas returning from the evaporator into the heat exchanger,
a bypass valve which regulates a flow rate of refrigerant gas flowing in the bypass line,
a regulating valve provided at the cooling tower outlet port, and
a series control part which controls the bypass valve and the regulating valve based on a measurement result of the cooling tower outlet port sensor,
wherein the series control part controls the bypass valve and the regulating valve so that the measurement result of the cooling tower outlet port sensor becomes a predetermined value.

8. The cooling system for an electronic device according to claim 7,
wherein the series control mechanism further comprises
an outside air temperature sensor which measures outside air temperature,
a bypass line which can feed the refrigerant gas returning from the evaporator into the heat exchanger, and
a bypass valve which regulates a flow rate of the refrigerant gas which flows in the bypass line,
wherein the series control part totally closes the regulating valve and totally opens the bypass valve to shut off return of the refrigerant gas to the cooling tower to guide all the refrigerant gas to the heat exchanger, when the measurement result of the outside air temperature sensor reaches a predetermined value or more.

9. The cooling system for an electronic device according to claim 8,
wherein the series control mechanism further comprises
an outside air temperature sensor which measures outside air temperature,
a bypass line which can feed the refrigerant gas returning from the evaporator into the heat exchanger, and
a bypass valve which regulates a flow rate of the refrigerant gas which flows in the bypass line,
wherein the series control part totally closes the regulating valve and totally opens the bypass valve to shut off return of the refrigerant gas to the cooling tower to guide all the refrigerant gas to the heat exchanger, when the measurement result of the outside air temperature sensor reaches a predetermined value or more.

10. The cooling system for an electronic device according to claim 7,
wherein the series control mechanism further comprises
an outside air temperature sensor which measures outside air temperature,
a bypass line which can feed the refrigerant gas returning from the evaporator into the heat exchanger, and
a bypass valve which regulates a flow rate of the refrigerant gas which flows in the bypass line,
wherein the series control part totally closes the regulating valve and totally opens the bypass valve to shut off return of the refrigerant gas to the cooling tower to guide all the refrigerant gas to the heat exchanger, when the measurement result of the outside air temperature sensor reaches a predetermined value or more.

11. A cooling system for an electronic device, comprising:
an evaporator which cools exhaust air from the electronic device by vaporizing a refrigerant with heat generating from the electronic device;
a cooling tower which is provided at a place higher than the evaporator, cools the refrigerant and condenses the vaporized refrigerant;
a circulation line in which the refrigerant naturally circulates between the evaporator and the cooling tower;
an air-conditioning machine which cools high-temperature air taken in from a device room; and returns the air into the device room; and
an air-conditioning circulation line which is branched from the circulation line, and circulates the refrigerant to and from a cooling part of the air-conditioning machine.

12. The cooling system for an electronic device according to claim 1, further comprising:
an air-conditioning machine which cools high-temperature air taken in from a device room, and returns the air into the device room; and
an air-conditioning circulation line which is branched from the circulation line, and circulates the refrigerant to and from a cooling part of the air-conditioning machine.

13. The cooling system for an electronic device according to claim 12,
wherein the plurality of electronic devices are divided into a plurality of groups, heat exchangers for groups are provided halfway through the circulation line by the number of groups into which the electronic devices are divided, and
wherein the circulation line is constituted of a main circulation line in which the refrigerant circulates between the cooling tower and/or the heat exchanger and the heat exchangers for a group, and a group circulation line in which the refrigerant circulates between the heat exchangers for groups and the evaporator and/or the cooling part of the air-conditioning machine.

14. The cooling system for an electronic device according to claim 13,
wherein the plurality of electronic devices are divided into a plurality of groups, heat exchangers for groups are provided halfway through the circulation line by the number of groups into which the electronic devices are divided, and
wherein the circulation line is constituted of a main circulation line in which the refrigerant circulates between the cooling tower and/or the heat exchanger and the heat exchangers for a group, and a group circulation line in which the refrigerant circulates between the heat exchangers for groups and the evaporator and/or the cooling part of the air-conditioning machine.

15. The cooling system for an electronic device according to claim 1, further comprising:
a flow rate regulating device which is provided in a refrigerant gas flow path at a position of the evaporator outlet port of the circulation line, and regulates a refrigerant flow rate;
a temperature sensor which detects temperature of air discharged from the evaporator; and
a controller which controls the flow rate regulating device,
wherein the controller controls the flow rate regulating device so that the temperature sensor indicates a predetermined value.

16. The cooling system for an electronic device according to claim 4, further comprising:
- a flow rate regulating device which is provided in a refrigerant gas flow path at a position of the evaporator outlet port of the circulation line, and regulates a refrigerant flow rate;
- a temperature sensor which detects temperature of air discharged from the evaporator; and
- a controller which controls the flow rate regulating device, wherein the controller controls the flow rate regulating device so that the temperature sensor indicates a predetermined value.

17. The cooling system for an electronic device according to claim 1, wherein the electronic device is a server.

18. The cooling system for an electronic device according to claim 5, wherein the electronic device is a server.

* * * * *